(12) United States Patent
Chang et al.

(10) Patent No.: US 11,456,738 B1
(45) Date of Patent: Sep. 27, 2022

(54) SWITCH DEVICE PROVIDING EQUAL VOLTAGE DISTRIBUTION

(71) Applicant: RichWave Technology Corp., Taipei (TW)

(72) Inventors: Hang Chang, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 17/494,852

(22) Filed: Oct. 6, 2021

(30) Foreign Application Priority Data

Aug. 4, 2021 (TW) .............................. TW110128710

(51) Int. Cl.
*H03K 17/687* (2006.01)
(52) U.S. Cl.
CPC ................................. *H03K 17/6871* (2013.01)
(58) Field of Classification Search
CPC .................................................. H03K 17/6871
See application file for complete search history.

(56) References Cited

U.S. PATENT DOCUMENTS

| 6,996,376 | B2 * | 2/2006 | Clifton | ..................... | H04B 1/44 |
| | | | | | 333/101 |
| 9,887,637 | B1 * | 2/2018 | Shah | ....................... | H02M 1/08 |
| 10,483,968 | B2 * | 11/2019 | Jo | ..................... | H03K 17/08122 |
| 10,749,501 | B2 | 8/2020 | Ju | | |
| 2013/0187698 | A1 * | 7/2013 | Otobe | .............. | H04W 52/0274 |
| | | | | | 327/299 |

OTHER PUBLICATIONS

Office action dated Apr. 15, 2022 for the Taiwan application No. 110128710, filing date Aug. 4, 2021, pp. 1-9.

\* cited by examiner

*Primary Examiner* — Metasebia T Retebo
(74) *Attorney, Agent, or Firm* — Winston Hsu

(57) ABSTRACT

A switch device includes a signal input terminal and a switch circuit. The signal input terminal is used to receive a radio frequency signal. The switch circuit is coupled to the signal input terminal, and includes a first transistor and a second transistor. The first transistor includes a control terminal used to receive a first control voltage to turn off the first transistor; a first terminal; and a second terminal. The second transistor includes a control terminal used to receive a second control voltage to turn off the second transistor; a first terminal; and a second terminal. The second control voltage is different from the first control voltage.

18 Claims, 6 Drawing Sheets

US 11,456,738 B1

SWITCH DEVICE PROVIDING EQUAL VOLTAGE DISTRIBUTION

CROSS REFERENCE TO RELATED APPLICATION

This non-provisional application claims priority of Taiwan patent application No. 110128710, filed on 4 Aug. 2021, included herein by reference in its entirety.

TECHNICAL FIELD

The invention relates to a radio frequency circuit, and in particular, to a switch device for switching radio frequency signals.

BACKGROUND

Radio frequency (RF) switch devices can direct RF signals to pass through one or more transmission paths, and are widely used in televisions, mobile phones, wireless communication devices and satellite communication devices. Nevertheless, owing to the effect of parasitic capacitances, the RF switch devices may be unable to turn off the transmission paths that are not used to transmit the RF signal, leading to the abnormal operation of the RF switch devices.

SUMMARY

According to an embodiment of the invention, a switch device includes an input terminal and a first switch circuit. The input terminal is used to receive a radio frequency signal. The first switch circuit is coupled to the input terminal, and includes a first transistor and a second transistor. The first transistor includes a first control terminal used to receive a first control voltage to turn off the first transistor, a first terminal, and a second terminal. The second transistor includes a first control terminal used to receive a second control voltage to turn off the second transistor, a first terminal coupled to the second terminal of the first transistor, and a second terminal. The second control voltage is different from the first control voltage;

According to another embodiment of the invention, a switch device includes an input terminal and a first switch circuit. The input terminal is used to receive a radio frequency signal. The first switch circuit is coupled to the input terminal, and includes a first transistor and a second transistor. The first transistor includes a first control terminal configured to receive a first control voltage to turn off the first transistor, a second control terminal configured to receive a first auxiliary voltage, a first terminal, and a second terminal. The second transistor includes a first control terminal configured to receive a second control voltage to turn off the second transistor, a second control terminal configured to receive a second auxiliary voltage, a first terminal coupled to the second terminal of the first transistor, and a second terminal. The first auxiliary voltage is different from the second auxiliary voltage.

DETAILED DESCRIPTION

Figure 1:
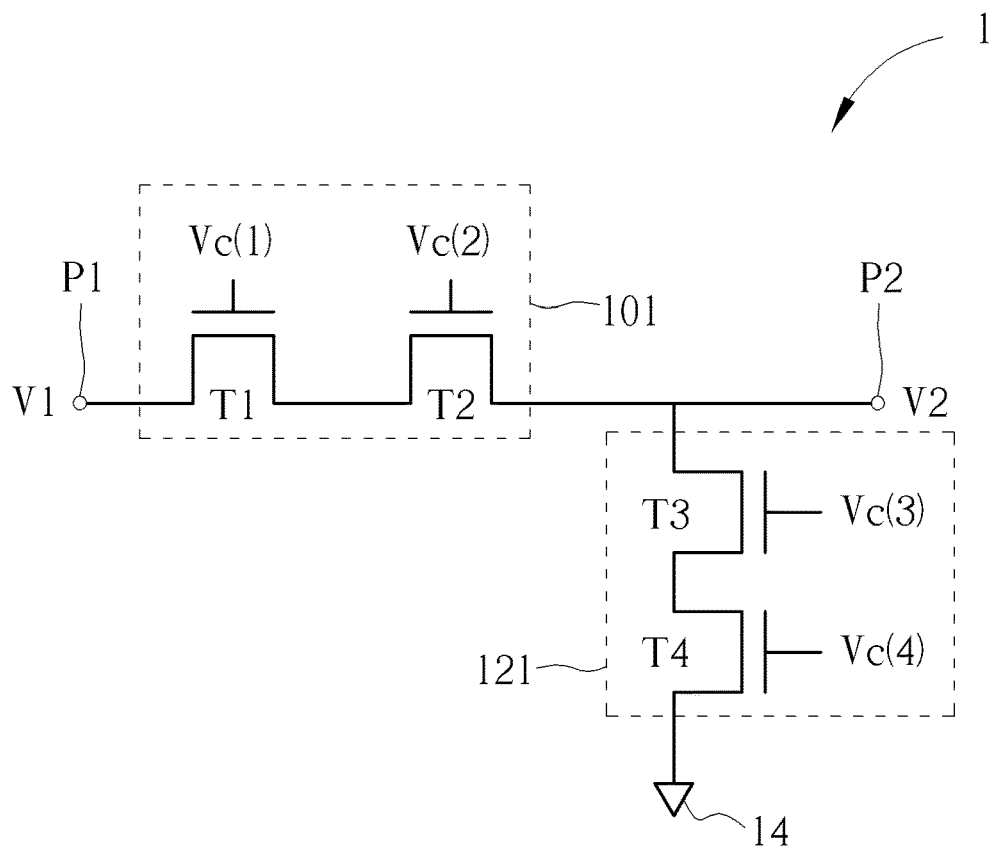
FIG. 1 is a schematic diagram of a switch device according to an embodiment of the invention.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

FIG. 1 is a schematic diagram of a switch device 1 according to an embodiment of the invention. The switch device 1 is a single pole single throw (SPST) switch for transmitting or receiving radio frequency signals.

The switch device 1 may include signal terminals P1 and P2, and switch circuits 101 and 121. In some embodiments of signal transmission, the signal terminal P1 may serve as an input terminal to receive a radio frequency signal V1, and the signal terminal P2 may serve as an output terminal to output a radio frequency signal V2. In some embodiments of signal reception, the signal terminal P2 may serve as an input terminal to receive a radio frequency signal V2, and the signal terminal P1 may serve as an output terminal to output a radio frequency signal V1.

The switch circuit 101 is coupled to the signal terminals P1 and P2, and may include stacked transistors T1 and T2. The transistor T1 includes a first control terminal, a first terminal, and a second terminal. The transistor T2 includes a first control terminal, a first terminal coupled to the second terminal of the transistor T1, and a second terminal. The switch circuit 121 is coupled to the signal terminal P2 and the switch circuit 101, and may include stacked transistors T3 and T4. The transistor T3 includes a first control terminal, a first terminal coupled to the second terminal of the transistor T2, and a second terminal. The transistor T4 includes a first control terminal, a first terminal coupled to the second terminal of the transistor T3, and a second terminal coupled to the reference terminal 14. In some embodiments, the reference terminal 14 may be a ground terminal. The transistors T1 to T4 may be of the same type of transistors, and may be N-type transistors or P-type transistors. In FIG. 1, the transistors T1 to T4 are NMOS transistors.

A path between the signal terminals P1 and P2 may be configured into a connection state or a disconnection state. In the connection state, the transistors T1 and T2 may be turned on and the transistors T3 and T4 may be turned off, a first connected path may be formed between the signal terminals P1 and P2, and the transistors T1 and T2 may be regarded as serial-connected resistors. In the disconnection state, the transistors T1 and T2 may be turned off and the transistors T3 and T4 may be turned on, a first disconnected path may be formed between the signal terminals P1 and P2, and the transistors T1 and T2 may be regarded as serial-connected OFF capacitors. In the disconnection state, the voltages across the stacked transistors in the switch circuit 101 are substantially identical. For example, in the disconnection state, the voltage between the first terminal and the second terminal of the transistor T1 of the switch circuit 101 is substantially equal to the voltage between the first terminal and the second terminal of the transistor T2. Therefore, in the disconnection state, the voltages across the stacked transistors in the switch circuit 101 show an even voltage distribution, so as to reduce the number of stacked transistors while preventing the transistors from being turned on or damaged.

While the switch circuit 101 and the switch circuit 121 of FIG. 1 respectively include only two transistors, in some embodiments, the switch circuit 101 and the switch circuit 121 may respectively include N transistors and M transistors, N and M being positive integers exceeding 1, and N and M may be equal or unequal to each other.

In some embodiments, the switch circuit 121 in FIG. 1 may include other numbers of transistors (e.g., 1 transistor), or apply different control voltages and/or auxiliary voltages to the stacked transistors (such as the transistors T1 and T2), to provide different OFF capacitances for the transistors during a turn-off time, so as to achieve an even voltage distribution of stacked transistors between the signal terminals P1 and P2, thereby reducing the number of the stacked transistors while preventing the transistors from being turned on or damaged. The operations of the other components are similar to those in the original switch device 1, and will not be repeated here for brevity.

Figure 2:
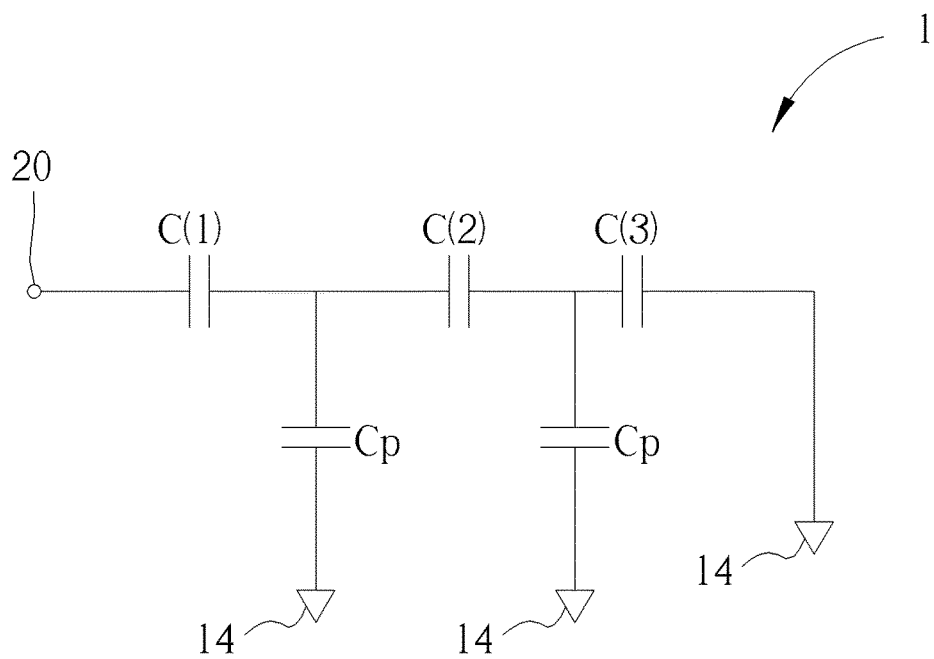
FIG. 2 is a schematic diagram of an equivalent circuit of a first disconnected path of the switch device in FIG. 1.

FIG. 2 is a schematic diagram of an equivalent circuit of a first disconnected path of the switch device 1. The switch device 1 of FIG. 2 is similar to that of FIG. 1, except that the switch circuit 101 includes three transistors. FIG. 2 shows an OFF capacitance C(1) of a first transistor, an OFF capacitance C(2) and a parasitic capacitance Cp of a second transistor, and an OFF capacitance C(3) and a parasitic capacitance Cp of a third transistor, and the input terminal 20. The OFF capacitances C(1) to C(3) may be equivalent capacitances across the first to third transistors in the disconnection state, respectively. If the first to third transistors are identical in transistor size, capacitance characteristic and bias voltage, the OFF capacitances C(1) to C(3) will be all equal to the capacitance Cs (not shown). The parasitic capacitance Cp may be the equivalent capacitance between the corresponding transistor and a substrate or between the corresponding transistor and wires. The size of the parasitic capacitance Cp is dependent on the manufacturing process, and a ratio r of the parasitic capacitance Cp to the capacitance Cs may be substantially 2%. The switch device 1 in FIG. 2 may receive a radio frequency signal from the input terminal 20 and generate voltages Vx1 to Vx3 between the first to third transistors being turned-off. If the OFF capacitances C(1) to C(3) are the same, the effect of the parasitic capacitance Cp will result in different voltage Vx1 to Vx3 across the OFF capacitances C(1) to C(3), as expressed by Equation (1):

$$Vx1:Vx2:Vx3=(1+r)^2:(1+0:1 \qquad \text{Equation (1)}$$

Where Vx1 to Vx3 are respectively the voltages across the first to third transistors;

$$r=Cp/Cs;$$

Cp is the parasitic capacitance; and

Cs is the capacitance between the first terminal and the second terminal of any one of the first to third transistors.

Equation (1) shows that the voltages Vx1 to Vx3 across the first to third transistors are decreased in sequence. The first transistor may be destroyed owing to the excessively large voltage Vx1, and thus will not stay turned off. Therefore, it is necessary to compensate for the OFF capacitance of the stacked transistors of the switch circuit 101 to reduce the excessive voltage drops and reduce the number of stacked transistors.

In order to compensate for the effect of the parasitic capacitances Cp, the OFF capacitance C(1) is set to be greater than the OFF capacitance C(2), and the OFF capacitance C(2) is set to be greater than the OFF capacitance C(3) in the embodiment. In some embodiments, the switch circuit 101 comprises N transistors, and the OFF capacitance C(n) of the nth transistor may be determined according to the OFF capacitance C(n+1) of the (n+1)th transistor and the parasitic capacitance Cp, as expressed by Equation (2):

$$C(n)=C(n+1)+(N-n)*Cp \qquad \text{Equation (2)}$$

Where C(n) and C(n+1) are respectively the OFF capacitances of the nth transistor and the (n+1)th transistor, n being a positive integer less than N; and Cp is the parasitic capacitance;

For example, in FIG. 2, N=3, C(2)=C(3)+Cp, C(1)=C(2)+2Cp. When the OFF capacitances C(1) to C(N) satisfy Equation (2), the voltages Vx1 to VxN will be the same, achieving an even voltage distribution across the N transistors.

The OFF capacitance of the transistor may be controlled by the control voltage at the first control terminal. Referring to FIG. 1, in some embodiments, in the disconnection state, the first control terminal of the transistor T1 may receive the control voltage Vc(1) to turn off the transistor T1, and the first control terminal of the transistor T2 may receive the control voltage Vc(2) to turn off the transistor T2, the first control terminal of the transistor T3 may receive the control voltage Vc(3) to turn on the transistor T3, and the first control terminal of the transistor T4 may receive the control voltage Vc(4) to turn on the transistor T4. The control voltage Vc(1) is different from the control voltage Vc(2). In some embodiments, the absolute value of the control voltage Vc(1) is less than the absolute value of the control voltage Vc(2). The control voltage Vc(3) may be substantially equal to or different from the control voltage Vc(4). For example, the control voltage Vc(3) may be equal to the control voltage Vc(1), and the control voltage Vc(4) may be equal to the control voltage Vc(2). In other embodiments, the control voltage Vc(1) and the control voltage Vc(2) are set to have a difference therebetween to be positively correlated to the magnitude of the radio frequency signal, and the control voltage Vc(3) is set to be substantially equal to the control voltage Vc(4) in order to reduce the number of negative voltages required and simplify the circuit.

Figure 3:
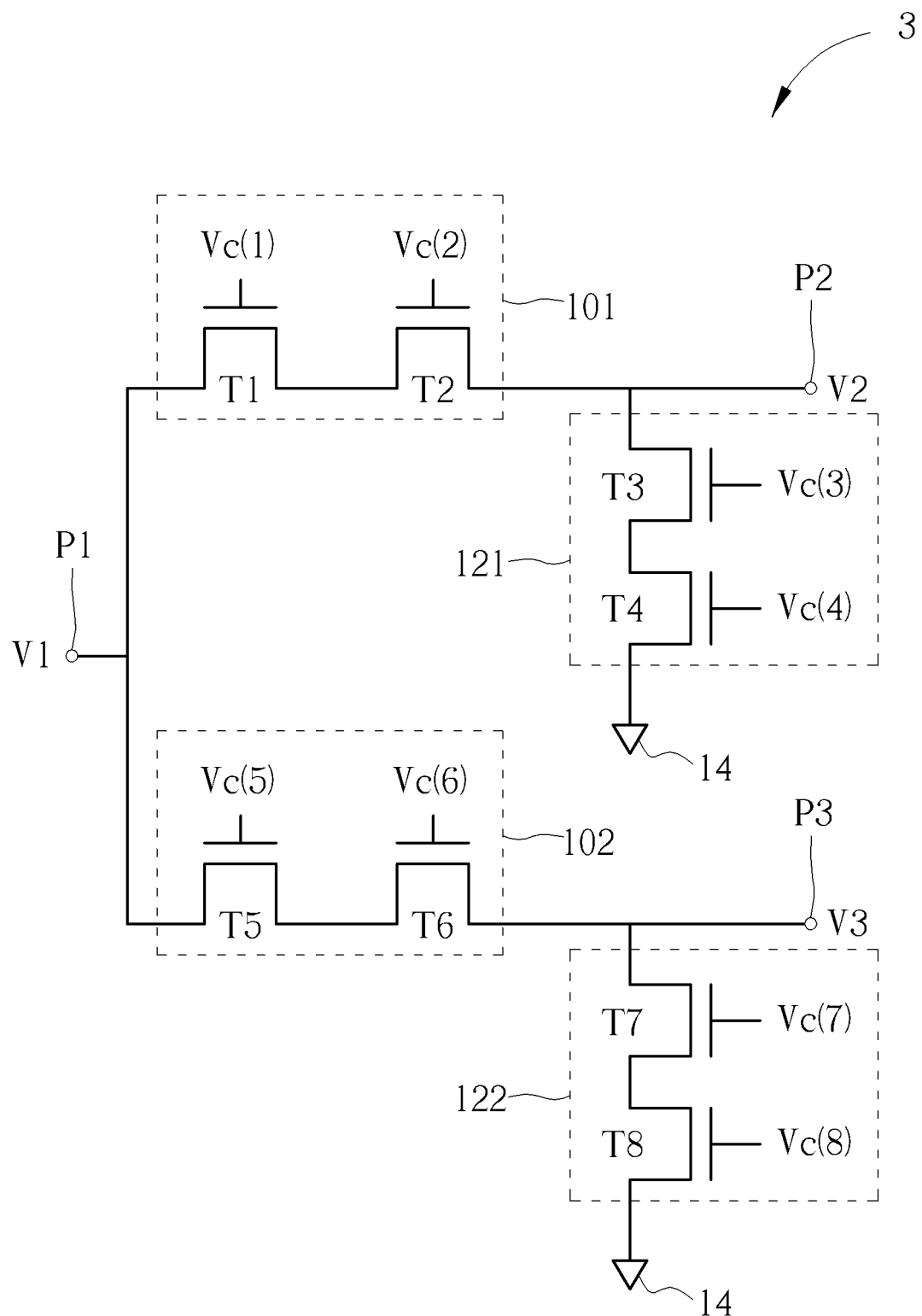
FIG. 3 is a schematic diagram of a switch device according to another embodiment of the invention.

FIG. 3 is a schematic diagram of a switch device 3 according to another embodiment of the invention. The switch device 3 is a single pole double throw (SPDT) switch. The difference between the switch device 3 and the switch device 1 lies in that the switch device 3 further includes a signal terminal P3 and switch circuits 102 and 122. The difference between the switch device 3 and the switch device 1 will be explained as follows. In some embodiments of signal transmission, the signal terminal P1 may serve as an input terminal to receive a radio frequency signal V1, and one of the signal terminals P2 and P3 may serve as an output terminal to output one of radio frequency signals V2 and V3. In some embodiments of signal reception, one of the signal terminals P2 and P3 may serve as an input terminal to receive one of radio frequency signals V2 and V3, and the signal terminal P1 may serve as an output terminal to output a radio frequency signal V1.

A path between the signal terminals P1 and P3 may be configured into a connection state or a disconnection state. In the connection state, the transistors T5 and T6 may be turned on and the transistors T7 and T8 may be turned off, a second connected path may be formed between the signal terminals P1 and P3, and the transistors T5 and T6 may be regarded as serial-connected resistors. In the disconnection state, the transistors T5 and T6 may be turned off and the transistors T7 and T8 may be turned on, a second disconnected path may be formed between the signal terminals P1 and P3, and the transistors T5 and T6 may be regarded as serial-connected OFF capacitors. When the switch device 3 is in operation, one pair of the signal terminals P1 and P2 and the signal terminals P1 and P3 may be set to the connection state, and the other pair may be set to the disconnection state. For explanation in the following paragraphs, the first disconnected path is formed between the signal terminals P1 and P2 and the second connected path is formed between the signal terminals P1 and P3.

The switch circuit 102 is coupled to the signal terminals P1 and P3, and may include stacked transistors T5 and T6. The transistor T5 includes a first control terminal, a first terminal, and a second terminal. The transistor T6 includes a first control terminal, a first terminal coupled to the second terminal of the transistor T5, and a second terminal. The switch circuit 122 is coupled to the signal terminal P3 and the switch circuit 102, and may include stacked transistors T7 and T8. The transistor T7 includes a first control terminal, a first terminal coupled to the second terminal of the transistor T6, and a second terminal. The transistor T8 includes a first control terminal, a first terminal coupled to the second terminal of the transistor T7, and a second terminal coupled to the reference terminal 14. The transistors T1 to T8 may be of the same type of transistors, and may be N-type transistors or P-type transistors. In FIG. 3, the transistors T1 to T8 are NMOS transistors.

In some embodiments, when forming the second connected path, the first control terminal of the transistor T5 may receive the control voltage Vc(5) to turn on the transistor T5, and the first control terminal of the transistor T6 may receive the control voltage Vc(6) to turn on the transistor T6, the first control terminal of the transistor T7 may receive the control voltage Vc(7) to turn off the transistor T7, and the first control terminal of the transistor T8 may receive the control voltage Vc(8) to turn off the transistor T8. In some embodiments, the control voltage Vc(1) is substantially equal to the control voltage Vc(7), the control voltage Vc(2) is substantially equal to the control voltage Vc(8), the control voltage Vc(3) is substantially equal to the control voltage Vc(5), and the control voltage Vc(4) is substantially equal to the control voltage Vc(6).

In some embodiments, the switch circuits 121 and 122 in FIG. 3 may include other numbers of transistors (e.g., 1 transistor), or different control voltages and/or auxiliary voltages may be applied to the stacked transistors (such as the transistors T1, T2, T5 and T6), so as to provide different OFF capacitances for the transistors during the turn-off time, achieving an even voltage distribution between the first terminal and the second terminal of stacked transistors, thereby reducing the number of the stacked transistors while preventing the transistors from being turned on or damaged. The operations of the other components are similar to those in the original switch device 3, and will not be repeated here for brevity.

Figure 4:
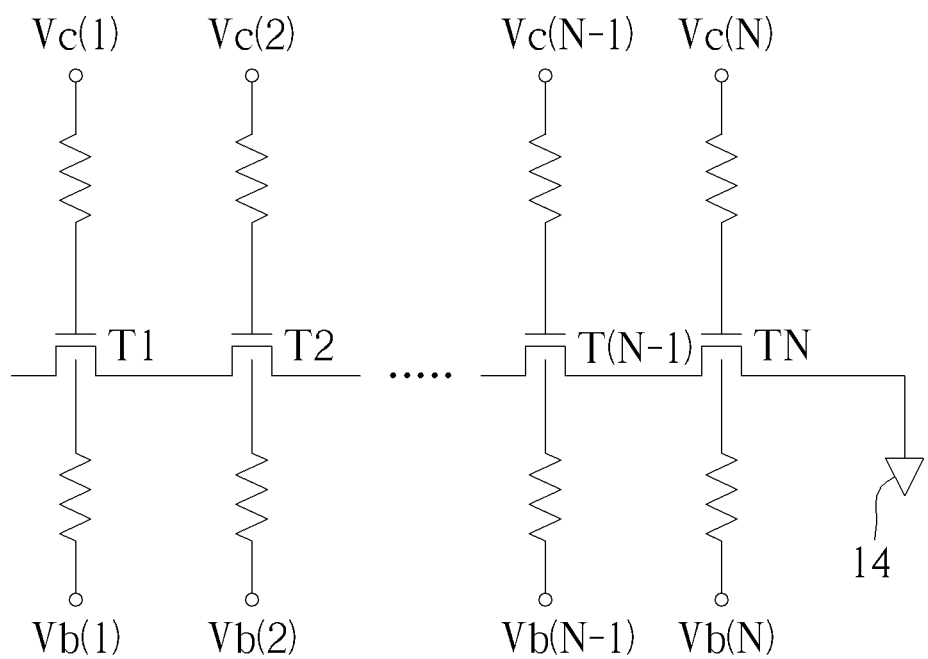
FIG. 4 is a schematic diagram of an equivalent circuit of another first disconnected path of the switch device in FIG. 1 or 3.

FIG. 4 is a schematic diagram of an equivalent circuit of another first disconnected path of the switch device 1 or 3. The switch device of FIG. 4 is similar to that of FIG. 1, except that the switch circuit 101 includes transistors T1 to TN. Each transistor T1 to TN includes a first control terminal, a second control terminal, a first terminal, and a second terminal. The transistors T1 to TN may be of the same type of transistors, and may be N-type transistors or P-type transistors. In FIG. 4, the transistors T1 to TN are NMOS transistors. For each transistor T1 to TN, the first control terminal thereof may be a gate terminal, the second control terminal thereof may be a bulk terminal, the first terminal thereof may be a drain terminal, and the second terminal thereof may be a source terminal. The transistors T1 to TN may receive the control voltages Vc(1) to Vc(N) via the respective gate resistors, and receive the auxiliary voltages Vb(1) to Vb(N) via the respective bulk resistors. In some embodiments, the control voltages Vc(1) to Vc(N) and/or the auxiliary voltages Vb(1) to Vb(N) may be used to control the OFF capacitances of the transistors T1 to TN when they are off.

Figure 5A:
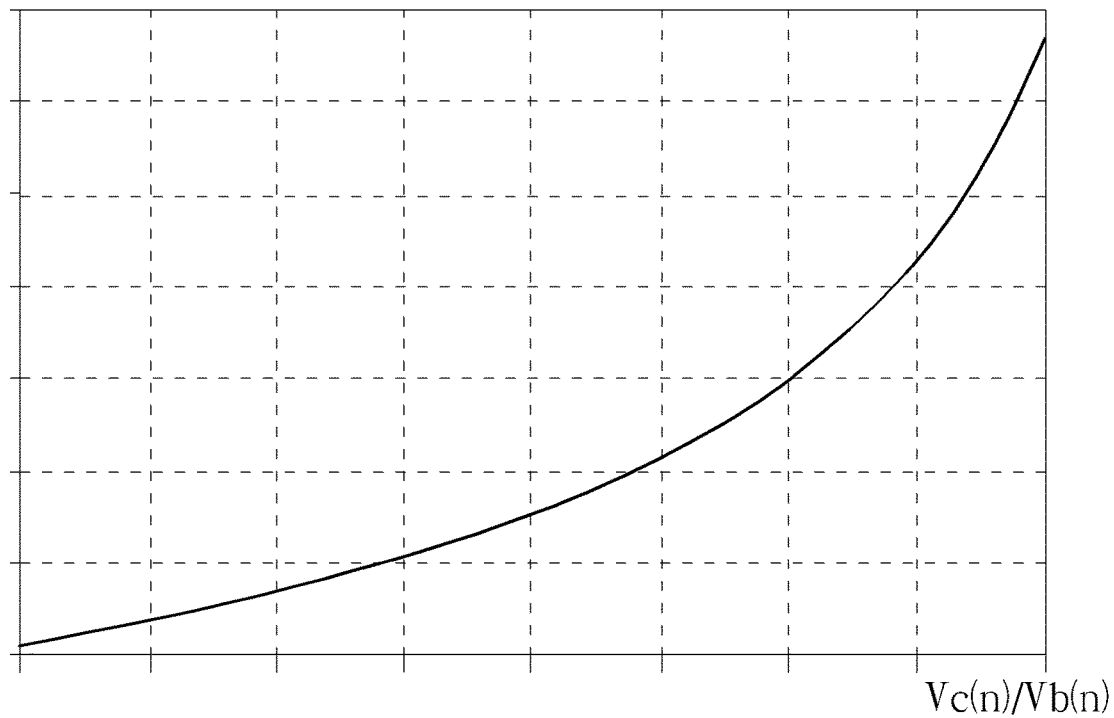
FIG. 5A shows the relationship between a control voltage/auxiliary voltage and an OFF capacitance of a transistor.

In some embodiments, the use of the control voltages Vc(1) to Vc(N) and/or the auxiliary voltages Vb(1) to Vb(N) for controlling the OFF capacitances of transistors T1 to TN may be fabricated by various processes, for example, a complementary metal oxide semiconductor (CMOS) process, a silicon germanium (SiGe) process, a silicon-on-insulator (SOI) process, and any process that may be used to design switch circuits. For example, different control voltages are used to control the OFF capacitances of individual transistors, different auxiliary voltages are used to control the capacitances of the individual transistors, and different or the same control voltage and/or auxiliary voltage are used to control the capacitances of the individual transistors. In the following paragraphs, a complementary metal oxide semiconductor manufacturing process is adopted to illustrate an embodiment of using different auxiliary voltages to control the capacitance of the individual transistors. In one example, the auxiliary voltages Vb(1) to Vb(N) are used in the complementary metal oxide semiconductor process to control the OFF capacitances of the transistors T1 to TN. In FIG. 5A, voltage parameters such as the control voltages Vc(1) to Vc(N) and/or the auxiliary voltages Vb(1) to Vb(N) are controlled in the embodiment to obtain appropriate OFF capacitances Coff of the transistors T1 to TN, thereby achieving an even distribution of impedances and providing the most suitable voltage to each transistor. The voltage parameters and the capacitance Coff may exhibit an exponential relationship, and the appropriate OFF capacitance Coff of each of the transistors T1 to TN may be obtained by controlling the voltage parameters.

Figure 5B:
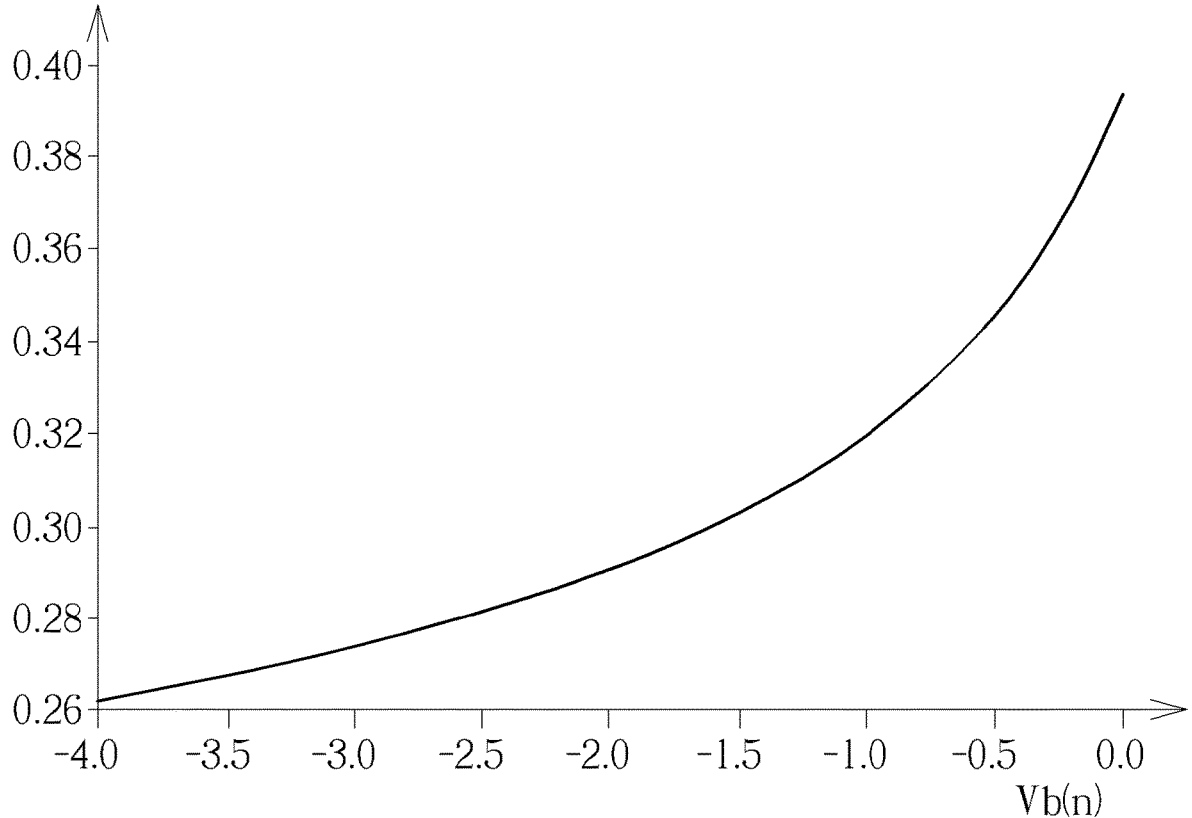
FIG. 5B shows the relationship between an auxiliary voltage and an OFF capacitance of a transistor.

FIG. 5B shows the relationship between the auxiliary voltage Vb(n) and the OFF capacitance Coff of the transistor Tn, where the horizontal axis represents the auxiliary voltage Vb(n), and the vertical axis represents the OFF capacitance Coff. When the auxiliary voltage Vb(n) is non-positive, the absolute value of the auxiliary voltage Vb(n) is negatively correlated to the OFF capacitance Coff of the transistor Tn. For example, for the CMOS 180 nm process, when the auxiliary voltage Vb(n) is equal to 0, the absolute value of the OFF capacitance Coff may be approximately 0.4 pF; and when the absolute value of the auxiliary voltage Vb(n) is equal to 4, the OFF capacitance Coff may be about 0.26 pF.

In FIG. 4, the auxiliary voltage Vb(1) to Vb(N) may be set to 0V or a negative value to turn off the transistors T1 to TN, and the absolute value of the auxiliary voltage Vb(n) may be set to be less than the absolute value of the auxiliary voltage Vb(n+1), thereby setting the transistor Tn to have an OFF capacitance exceeding an OFF capacitance of the transistor T(n+1). In some embodiments, at least one of the auxiliary voltages Vb(1) to Vb(n) may be negative in value. For example, the auxiliary voltage Vb(1) may be set to −4V to set the OFF capacitance of the transistor T1 approximately equal to 0.26 pF, and the auxiliary voltage Vb(2) may be set to −3.5V to set the OFF capacitance of the transistor T2 approximately equal to 0.27 pF, the absolute value of the auxiliary voltage Vb(1) is less than the absolute value of the auxiliary voltage Vb(2), and the OFF capacitance of the transistor T1 is greater than that of the transistor T2.

In some embodiments, the auxiliary voltage Vb(n) is substantially equal to the auxiliary voltage Vb(n+1). For example, the auxiliary voltage Vb(1) and the auxiliary voltage Vb(2) may be set to 0V. In other embodiments, the auxiliary voltage Vb(n) may be set substantially equal to the control voltage Vc(n), and the auxiliary voltage Vb(n+1) may be set substantially equal to the control voltage Vc(n+1). For example, the control voltage Vc(1) and the auxiliary voltage Vb(1) may be set to −3.5V, and the control voltage Vc(2) and the auxiliary voltage Vb(2) may be set to −4V. In other embodiments, the voltage difference between the control voltage Vc(n) and the auxiliary voltage Vb(n) is different from the voltage difference between the control voltage Vc(n+1) and the auxiliary voltage Vb(n+1). For example, the voltage difference between the control voltage Vc(1) and the auxiliary voltage Vb(1) may be set to 4V, and the voltage difference between the control voltage Vc(2) and the auxiliary voltage Vb(2) may be set to 3.5V. In other embodiments, at least one of the auxiliary voltage Vb(n) and the auxiliary voltage Vb(n+1) is negative. For example, the auxiliary voltage Vb(1) may be set to 0V, and the auxiliary voltage Vb(2) may be set to −0.5V. In other embodiments, the control voltage Vc(n) may be the same as the control voltage Vc(n+1), and the auxiliary voltage Vb(n) may be different from the auxiliary voltage Vb(n+1). For example, the control voltage Vc(n) and the control voltage Vc(n+1) may be 0V, the auxiliary voltage Vb(n) may be −3.5V, and the auxiliary voltage Vb(n+1) may be −4V.

Figure 6:
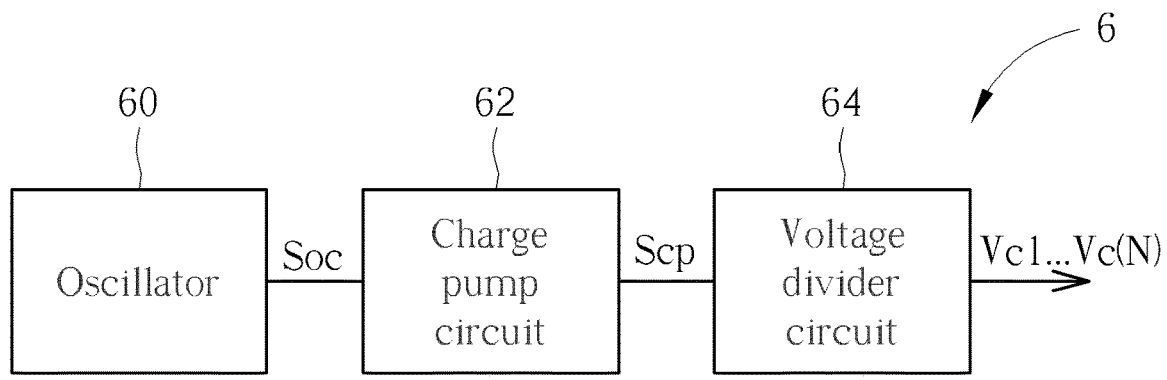
FIG. 6 is a circuit schematic of a voltage generation converter according to an embodiment of the invention.

FIG. 6 is a circuit schematic of a voltage generation converter 6 according to an embodiment of the invention. The voltage generation circuit 6 may generate control voltages Vc(1) to Vc(N) for use by the switch devices in FIGS. 1 to 4. The voltage generation circuit 6 may include an oscillator 60, a charge pump circuit 62 and a voltage divider circuit 64. The oscillator 60 may be coupled to the charge pump circuit 62, and the charge pump circuit 62 may be coupled to the voltage divider circuit 64.

The oscillator 60 may generate an oscillation signal Soc. The oscillation signal Soc may be a clock signal. The charge pump circuit 62 may generate the second voltage Scp using the first voltage according to the oscillation signal Soc. The first voltage may be a predetermined voltage level. The first voltage and the second voltage Scp may both be positive or negative at the same time, and the absolute value of the first voltage is less than that of the second voltage Scp. The voltage divider circuit 64 may generate the control voltages Vc(1) to Vc(N) according to the second voltage Scp. In some embodiments, the voltage generation circuit 6 may also generate the auxiliary voltages Vb(1) to Vb(N).

In some embodiments, the capacitance of the transistor may be controlled by the OFF capacitance between the terminals of the transistor, the transistor size and the length of the element. That is, the transistors T1 to TN are different.

Figure 7:
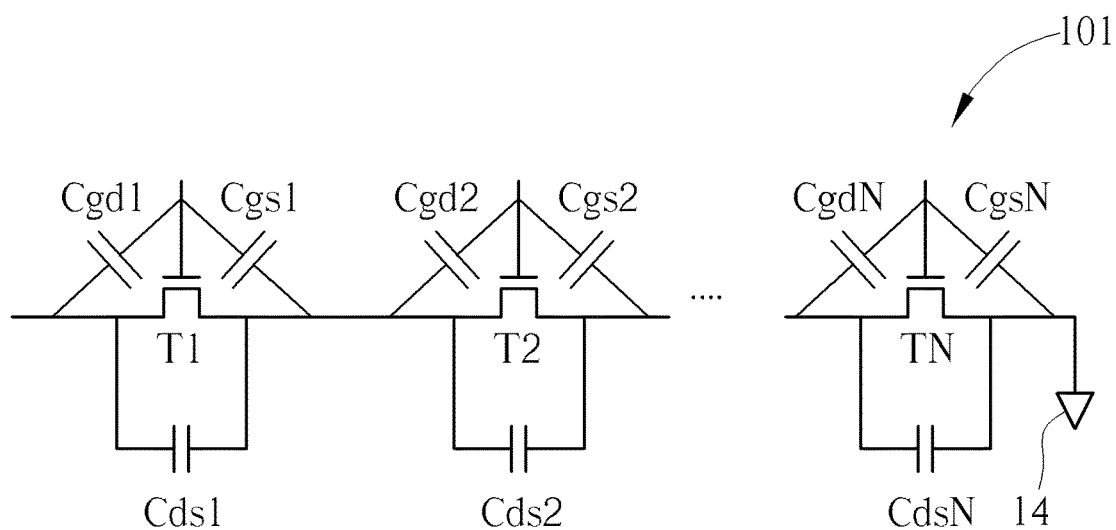
FIG. 7 is a circuit diagram of a disconnected path of another switch circuit of the switch device in FIG. 1 or 3.

FIG. 7 is a circuit schematic of the disconnected path of another switch circuit 101 of the switch device 1 or 3. The capacitances of the transistors T1 to TN are controlled by adjusting the OFF capacitances between the terminals of the transistors T1 to TN. The switch circuit 101 in FIG. 7 includes transistors T1 to TN, capacitors Cds1 to CdsN, capacitors Cgd1 to CgdN, and capacitors Cgs1 to CgsN. The transistors T1 to TN may each include a first control terminal, a first terminal, and a second terminal. Each of the capacitors Cgd1 to CgdN may be coupled between the first control terminal and the first terminal of the respective transistor T1 to TN. Each of the capacitors Cgs1 to CgsN may be coupled between the first control terminal and the second terminal of the respective transistor T1 to TN. Each of the capacitors Cds1 to CdsN may be coupled between the first terminal and the second terminal of the respective transistor T1 to TN. The adjusted OFF capacitance produced by the transistor Tn, the capacitance Cgd(n), the capacitance Cgs(n) and the capacitance Cds(n) may be greater than the adjusted OFF capacitance produced by the transistor T(n+1), the capacitance Cgd(n+1), the capacitance Cgs (n+1) and the capacitance Cds(n+1). For example, the OFF capacitance of the capacitor Cds1 may be equal to the capacitance of Cds2 plus the capacitance (N−1)*Cp, the capacitance of the capacitor Cgs(1) and the capacitance of the capacitor Cgs(2) may be equal, the capacitance of the capacitor Cds(1) and the capacitance of the capacitor Cds(2) may be equal, resulting in an adjusted capacitance of the transistor T1 equal to an adjusted OFF capacitance of the transistor T2 plus a capacitance (N−1)*Cp.

In some embodiments, the switch circuit 101 may further include a combination of the capacitors Cds1 to CdsN, the capacitors Cgd1 to CgdN, and the capacitors Cgs1 to CgsN to control the adjusted capacitances of the transistors T1 to TN.

Figure 8:
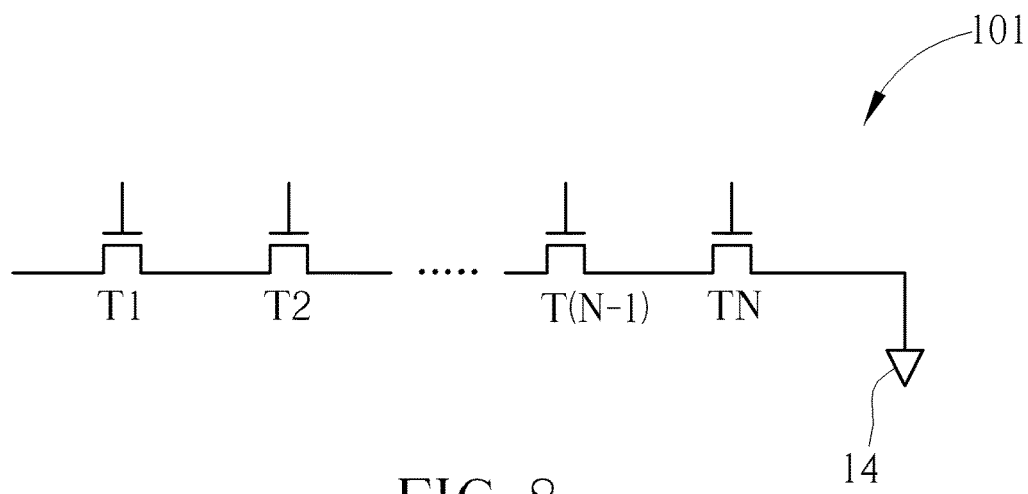
FIG. 8 is a circuit diagram of a disconnected path of another switch circuit of the switch device in FIG. 1 or 3.

FIG. 8 is a circuit schematic of the disconnected path of another switch circuit 101 of the switch device 1 or 3. In FIG. 8, the switch circuit 101 may control the OFF capacitances of the transistors T1 to TN by adjusting the transistor sizes of the transistors. The switch circuit 101 of FIG. 8 includes transistors T1 to TN, and each of the transistors T1 to TN has a different transistor size. In some embodiments, the transistor size An of the transistor Tn may be larger than the transistor size A(n+1) of the transistor T(n+1), as expressed by Equation (3):

$$An > A(n+1) \qquad \text{Equation (3)}$$

Figure 9:
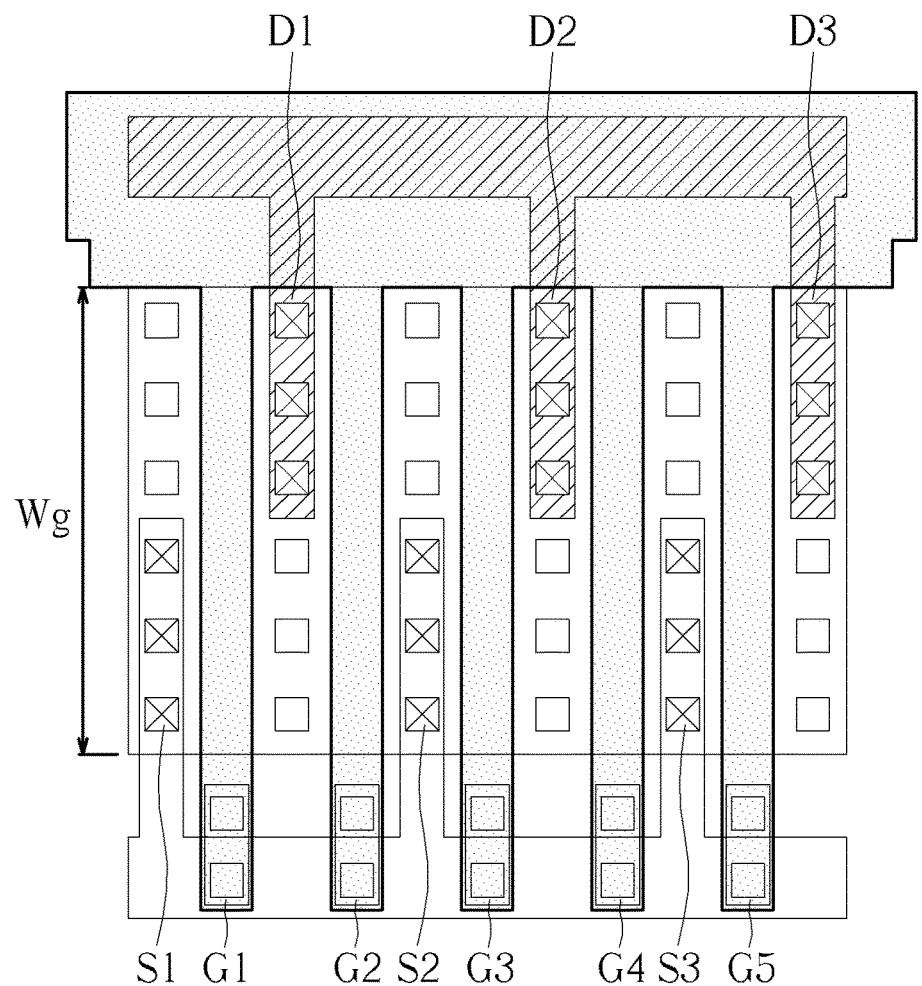
FIG. 9 shows a schematic diagram of a transistor size of a transistor.

The transistor size may be defined by a product of the width Wg and the number m of the gate fingers. FIG. 9 shows a schematic diagram of the transistor size of a transistor, including 3 drain fingers D1 to D3, 3 source fingers S1 to S3, 5 gate fingers G1 to G5 (m=5), each gate finger having a substantially identical width Wg. In some embodiments, the numbers m of gate fingers of the transistors T1 to TN in FIG. 8 may be sequentially reduced. For example, the transistor T1 may include 5 gate fingers, and the transistor T2 may include 4 gate fingers.

The switch circuit 101 in FIG. 8 may also control the OFF capacitances of the transistors T1 to TN by adjusting the lengths of the transistors. The distances S1 to SN between the respective first terminals and the respective second terminals of the transistors T1 to TN may be different. In some embodiments, the distance Sn between the first terminal and the second terminal of the transistor Tn may be less than the distance S(n+1) between the first terminal and the second terminal of the transistor T(n+1), as expressed by Equation (4):

$$Sn < S(n+1) \qquad \text{Equation (4)}$$

Figure 10:
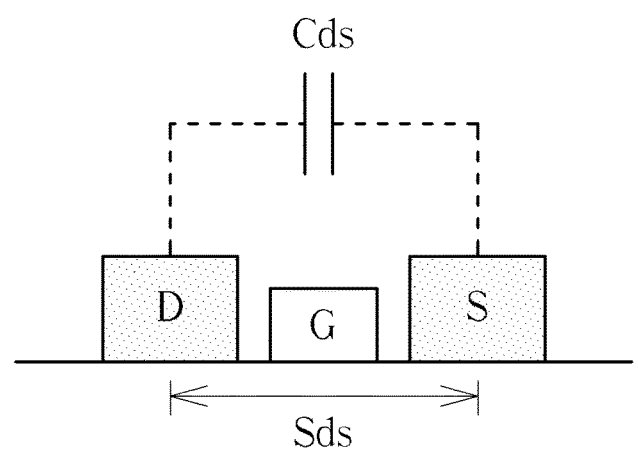
FIG. 10 shows a schematic diagram of a distance between a first terminal and a second terminal of a transistor.

FIG. 10 shows a schematic diagram of a distance Sds between a first terminal and a second terminal of a transistor. When the distance Sds is reduced, the equivalent capacitance Cds between the first terminal and the second terminal of the transistor will increase accordingly, thereby increasing the OFF capacitance of the transistor. In some embodiments, the distances S1 to SN of the transistors T1 to TN of FIG. 8 may increase sequentially. For example, the distance S1 of the transistor T1 may be 1 nm, and the distance S2 of the transistor T2 may be 1.2 nm. In some embodiments, the distance S(n) of the transistor T(n) may be 1.5 to 1.6 times of the distance S(n−1) of the transistor T(n−1). For example, the distance S1 of the transistor T1 may be 1 nm, and the distance S2 of the transistor T2 may be 1.5 nm.

In some embodiments, the switch circuit 101 may control the OFF capacitances of the transistors T1 to TN by adjusting a combination of the control voltages, the auxiliary voltages, the capacitance between the transistor terminals, the transistor sizes and the lengths of the transistors T1 to TN to achieve an even voltage distribution across the transistors T1 to TN.

In the embodiments in FIGS. 1-4 and 7-8, the capacitances of the transistors T1 to TN are controlled by adjusting the control voltages, the auxiliary voltage, the capacitances between the transistor terminals, and the transistor sizes or lengths of the transistors T1 to TN to reduce the number of stacked transistors while preventing the transistors from being turned on or damaged.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A switch device comprising:
an input terminal configured to receive a radio frequency signal; and
a first switch circuit coupled to the input terminal, and comprising:
a first transistor comprising:
a first control terminal configured to receive a first control voltage to turn off the first transistor;
a first terminal; and
a second terminal; and
a second transistor comprising:
a first control terminal configured to receive a second control voltage to turn off the second transistor, the second control voltage being different from the first control voltage;
a first terminal coupled to the second terminal of the first transistor; and
a second terminal;
wherein when the first transistor is turned off, a first equivalent capacitance is configured between the first terminal of the first transistor and the second terminal of the first transistor;
when the second transistor is turned off, a second equivalent capacitance is configured between the first terminal of the second transistor and the second terminal of the second transistor; and
the first equivalent capacitance exceeds the second equivalent capacitance.

2. The switch device of claim 1, wherein an absolute value of the first control voltage is less than an absolute value of the second control voltage.

3. The switch device of claim 1, further comprising:
an oscillator configured to generate an oscillation signal;
a charge pump circuit coupled to the oscillator, and configured to generate a second voltage from a first voltage according to the oscillation signal, an absolute value of the first voltage being less than an absolute value of the second voltage; and
a voltage divider circuit coupled to the charge pump circuit, and configured to generate the first control voltage and the second control voltage according to the second voltage.

4. The switch device of claim 1, wherein:
the first transistor further comprises a second control terminal configured to receive a first auxiliary voltage; and
the second transistor further comprises a second control terminal configured to receive a second auxiliary voltage.

5. The switch device of claim 4, wherein:
the first auxiliary voltage is substantially equal to the first control voltage; and
the second auxiliary voltage is substantially equal to the second control voltage.

6. The switch device of claim 4, wherein:
a voltage difference between the first control voltage and the first auxiliary voltage is different from a voltage difference between the second control voltage and the second auxiliary voltage.

7. The switch device of claim 4, wherein at least one of the first auxiliary voltage and the second auxiliary voltage is negative in value.

8. The switch device of claim 1, further comprising:
a second switch circuit coupled to the input terminal and the first switch circuit, and comprising:
a third transistor comprising a first control terminal configured to receive a third control voltage to turn on the third transistor, a first terminal, and a second terminal; and
a fourth transistor comprising a first control terminal configured to receive a fourth control voltage to turn on the fourth transistor, a first terminal coupled to the second terminal of the third transistor, and a second terminal.

9. The switch device of claim 8, further comprising:
a third switch circuit comprising:
a fifth transistor comprising a first control terminal configured to receive a fifth control voltage to turn on the fifth transistor, a first terminal coupled to the second terminal of the second transistor, and a second terminal; and
a sixth transistor comprising a first control terminal configured to receive a sixth control voltage to turn on the sixth transistor, a first terminal coupled to the second terminal of the fifth transistor, and a second terminal; and
a fourth switch circuit comprising:
a seventh transistor comprising a first control terminal configured to receive a seventh control voltage to turn off the seventh transistor, a first terminal coupled to the second terminal of the fourth transistor, and a second terminal; and an eighth transistor comprising a first control terminal configured to receive an eighth control voltage to turn off the eighth transistor, a first terminal coupled to the second terminal of the seventh transistor, and a second terminal.

10. The switch device of claim 9, wherein:
the first control voltage is substantially equal to the seventh control voltage;
the second control voltage is substantially equal to the eighth control voltage;
the third control voltage is substantially equal to the fifth control voltage; and
the fourth control voltage is substantially equal to the sixth control voltage.

11. The switch device of claim 1, further comprising:
a second switch circuit coupled to the first switch circuit, and comprising:
   a third transistor comprising a first control terminal configured to receive a third control voltage to turn on the third transistor, a first terminal coupled to the second terminal of the second transistor, and a second terminal; and
   a fourth transistor comprising a first control terminal configured to receive a fourth control voltage to turn on the fourth transistor, a first terminal coupled to the second terminal of the third transistor, and a second terminal coupled to a reference terminal.

12. The switch device of claim 11, wherein:
when the first transistor and the second transistor are turned off, and the third transistor and the fourth transistor are turned on, a difference between the first control voltage and the second control voltage is positively correlated to a magnitude of the radio frequency signal, and the third control voltage is substantially equal to the fourth control voltage.

13. The switch device of claim 1, wherein the first transistor and the second transistor are different.

14. The switch device of claim 13, wherein:
the first switch circuit further comprises:
   a first capacitor coupled between the first control terminal of the first transistor and the first terminal of the first transistor, the first control terminal of the first transistor and the second terminal of the first transistor, or the first terminal of the first transistor and the second terminal of the first transistor; and
   a second capacitor coupled between the first control terminal of the second transistor and the first terminal of the second transistor, the first control terminal of the second transistor and the second terminal of the second transistor, or the first terminal of the second transistor and the second terminal of the second transistor.

15. The switch device of claim 13, wherein:
a first transistor size of the first transistor and a second transistor size of the second transistor are different.

16. The switch device of claim 13, wherein:
a distance between the first terminal and the second terminal of the first transistor is different from a distance between the first terminal and the second terminal of the second transistor.

17. The switch device of claim 16, wherein:
a distance between the first terminal and the second terminal of the first transistor is less than a distance between the first terminal and the second terminal of the second transistor.

18. A switch device comprising:
an input terminal configured to receive a radio frequency signal; and
a first switch circuit coupled to the input terminal, and comprising:
   a first transistor comprising:
      a first control terminal configured to receive a first control voltage to turn off the first transistor;
      a second control terminal configured to receive a first auxiliary voltage;
      a first terminal; and
      a second terminal; and
   a second transistor comprising:
      a first control terminal configured to receive a second control voltage to turn off the second transistor;
      a second control terminal configured to receive a second auxiliary voltage, the first auxiliary voltage being different from the second auxiliary voltage;
      a first terminal coupled to the second terminal of the first transistor; and
      a second terminal.

* * * * *